(12) United States Patent
Murata

(10) Patent No.: US 7,452,612 B2
(45) Date of Patent: Nov. 18, 2008

(54) WIRING SUBSTRATE

(75) Inventor: Shinji Murata, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 79 days.

(21) Appl. No.: 11/412,266

(22) Filed: Apr. 26, 2006

(65) Prior Publication Data
US 2006/0280918 A1    Dec. 14, 2006

(30) Foreign Application Priority Data
Jun. 14, 2005    (JP) .............................. 2005-173440

(51) Int. Cl.
*B32B 3/00*    (2006.01)
(52) U.S. Cl. ........................ 428/548; 428/669; 428/210; 174/257; 174/261; 361/751
(58) Field of Classification Search ......... 174/260–261; 257/748, 751, 761, 763, 770; 361/760
See application file for complete search history.

(56) References Cited

U.S. PATENT DOCUMENTS 5,543,208 A * 8/1996 Hasler ........................ 428/210

6,742,248 B2 * 6/2004 Wong et al. .................... 29/840

FOREIGN PATENT DOCUMENTS

JP    2003-308791    10/2003

* cited by examiner

*Primary Examiner*—Cathy Lam
(74) *Attorney, Agent, or Firm*—Beyer Law Group LLP

(57) ABSTRACT

Provided is a wiring portion capable of suppressing diffusion from occurring in a wiring portion or between the wiring portion and a substrate.

In the wiring substrate, a first high melting point metal portion 18 having a melting point higher than Au and Ag is provided between an Au wiring portion 15 and an Ag wiring portion 17. The higher the melting point of the first high melting point metal portion 18, the lower a coefficient thereof, that is, the harder diffusion occurs. In addition, the first high melting point metal portion 19 functions as a barrier material which adequately suppresses Ag from being diffused from the Ag wiring portion 17. By providing the first high melting point metal portion 18 between the Au wiring portion 15 and the Ag wiring portion 17, it is possible to more efficiently suppress Ag from diffusion, in comparison with a case where the Ag wiring portion and the Au wiring portion are in contact with each other.

9 Claims, 4 Drawing Sheets

WIRING SUBSTRATE

BACKGROUND OF THE INVENTION

1. Field of the Invention

The present invention relates to a wiring substrate on which a wiring portion is formed.

2. Description of the Related Art

For example, in an electrode for a plasma display panel (PDP), a silver electrode (hereinafter, referred to as Ag wiring portion) and a gold electrode (hereinafter, referred to as Au wiring portion) are connected to each other, for the purpose of suppressing migration of silver.

However, diffusion occurred in an interface between the Au wiring portion and the Ag wiring portion. More or less, diffusion necessarily occurs in an interface between the wiring portions having different materials. In addition, silver is more easily diffused in comparison with gold. In other words, since silver has a significantly large diffusion coefficient, silver was diffused into the Au wiring portion and thus a void was generated in the Ag wiring portion. Accordingly, for example, when the wiring portion is formed and plating is performed on the surface of the wiring portion, it may be difficult to perform the plating at a place where the void is generated. In a worst case, disconnection may occur.

In addition, the diffusion may also occur between the Ag wiring portion and a substrate. In particular, when low temperature co-fired ceramic (LTCC) is used for the substrate, Ag was apt to be diffused into the substrate and thus the above-described problems have occurred.

SUMMARY OF THE INVENTION

Accordingly, the present invention is to solve the above-described problems, and it is an object of the present invention to provide a wiring substrate capable of adequately suppressing diffusion from occurring in a wiring portion or between the wiring portion and a substrate.

According to the present invention, there is provided a wiring substrate including a substrate; and a wiring portion formed on the substrate, wherein the wiring portion includes a first wiring portion made of Ag, a second wiring portion made of a material different from that of the first wiring portion, and a first high melting point metal portion interposed between the first wiring portion and the second wiring portion and having a melting point higher than those of the first wiring portion and the second wiring portion.

The high melting point metal is hardly diffused from the first wiring portion and the second wiring portion and functions as a barrier material capable of adequately suppressing Ag from being diffused from the first wiring portion which is in contact with the first high melting point metal portion. Accordingly, it is possible to adequately prevent Ag from being diffused from the first wiring portion to the second wiring portion. Thus, it is possible to adequately prevent a void from being formed in the wiring portion and to manufacture a wiring substrate in which disconnection is hard to occur, unlike the prior art.

In addition, in the present invention, a second high melting point metal portion having a melting point higher than those of the first wiring portion and the second wiring portion may be formed between the substrate and at least the first wiring portion. Accordingly, it is possible to adequately suppress Ag from being diffused between the first wiring portion and the substrate.

In addition, in the present invention, the first high melting point metal portion and the second high melting point metal portion may be made of a metal material containing at least one element of W, Mo, and Ta. These are metal materials having very high melting points and can prevent Ag from being diffused between the first wiring portion and the second wiring portion and between the first wiring portion and the substrate.

In addition, in the present invention, the first wiring portion and the second wiring portion may partially face each other in a height direction, and a high melting point metal portion in which the first high melting point metal portion and the second high melting point metal portion are integrally formed may be formed from a space between the first wiring portion and the second wiring portion to a space between the first wiring portion and the substrate. Accordingly, it is possible to efficiently suppress Ag from being diffused between the first wiring portion and the second wiring portion and between the first wiring portion and the substrate. Furthermore, since the first high melting point metal portion and the second high melting point metal portion need not be separately formed, it is possible to simply manufacture a desired wiring substrate.

According to the present invention, there is provided a wiring substrate including a substrate; and a wiring portion formed on the substrate, wherein the wiring portion includes a first wiring portion made of Ag, a second wiring portion made of a material different from that of the first wiring portion, and a composition changing portion which is interposed between the first wiring portion and the second wiring portion and in which a composition ratio of Ag contained in the first wiring portion gradually decreases from a side of the first wiring portion to a side of the second wiring portion.

In the present invention, since the composition ratio of Ag contained in the first wiring portion decreases toward the side of the second wiring portion in the composition changing portion, it is possible to more suppress Ag from being diffused into the second wiring portion, in comparison with the case where the first wiring portion and the second wiring portion are in contact with each other. The diffusion significantly occurs when Ag to be diffused is not contained in the second wiring portion before the diffusion or when the composition ratio of Ag contained in the second wiring portion is smaller than that in the first wiring portion although Ag is contained in the second wiring portion and a difference in the composition ratio of Ag occurs at an interface between the first wiring portion and the second wiring portion, and more particularly, when the difference in the composition ratio of Ag is large. Accordingly, by providing the composition changing portion in which the composition ratio of Ag decreases from the side of the first wiring portion to the side of the second wiring portion between the first wiring portion and the second wiring portion, it is possible to more decrease the composition ratio of Ag at the interface with the second wiring portion (decrease the difference in the composition ratio of Ag near the interface between the first wiring portion and the second wiring portion) and to decrease the difference in the composition ratio of Ag near the interface between the first wiring portion and the composition changing portion. Thus, it is possible to adequately suppress Ag from being diffused from the first wiring portion to the second wiring portion.

In the present invention, the composition changing portion may contain Ag and Pd and a composition ratio of Pd may increase from the side of the first wiring portion to the side of the second wiring portion. Accordingly, it is possible to adequately suppress Ag from being diffused into the second wiring portion.

In addition, in the present invention, a high melting point metal portion having a melting point higher than those of the first wiring portion and the second wiring portion may be formed between the substrate and at least the first wiring portion. Accordingly, it is possible to suppress Ag from being diffused between the first wiring portion and the substrate.

In addition, in the present invention, the high melting point metal portion may be made of a metal material containing at least one element of W, Mo, and Ta. These are metal materials having very high melting points and can prevent Ag from being diffused from the first wiring portion.

In the present invention, a cover portion may be formed on at least a face of the first wiring portion. By forming the cover portion, it is possible to adequately suppress migration of Ag.

In the present invention, the second wiring portion may be made of Au. Au has a higher specific resistance and a worse electrical property than Ag, but is harder to be diffused than Ag. Accordingly, when the second wiring portion made of Au is formed in a fine portion, a portion in which an interval between the wiring portions is small, or a high-precision portion, it is possible to provide a reliable wiring substrate.

In addition, a face of the second wiring portion may be a connection surface of a connection electrode of an electronic part provided on the wiring substrate.

In addition, in the present invention, the substrate may be made of low temperature co-fired ceramic. In this case, in particular, since Ag of the first wiring portion is apt to be diffused into the substrate, it is possible to efficiently suppress Ag from being diffused into the substrate by applying the present invention.

According to the present invention, it is possible to adequately suppress Ag from being diffused from the first wiring portion containing Ag to the second wiring portion or the substrate. Thus, it is possible to adequately prevent a void from being formed in the wiring portion unlike the prior art and to manufacture a wiring substrate which is harder to be disconnected.

DESCRIPTION OF THE PREFERRED EMBODIMENTS

Figure 1:
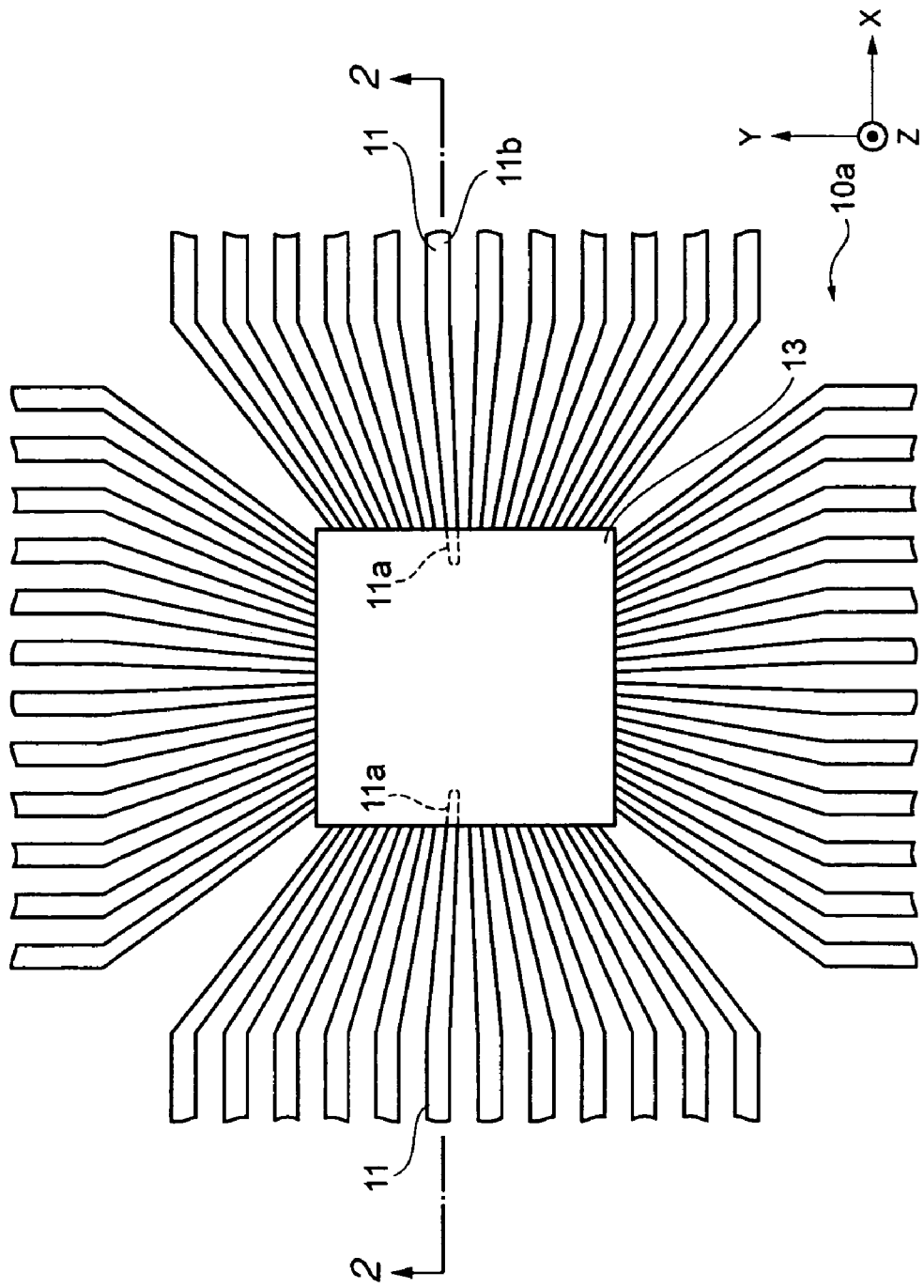
FIG. 1 is a partial plan view of a wiring substrate and an electronic part for showing a state that the electronic part is mounted on the wiring substrate according to an embodiment of the present invention.
Figure 2:
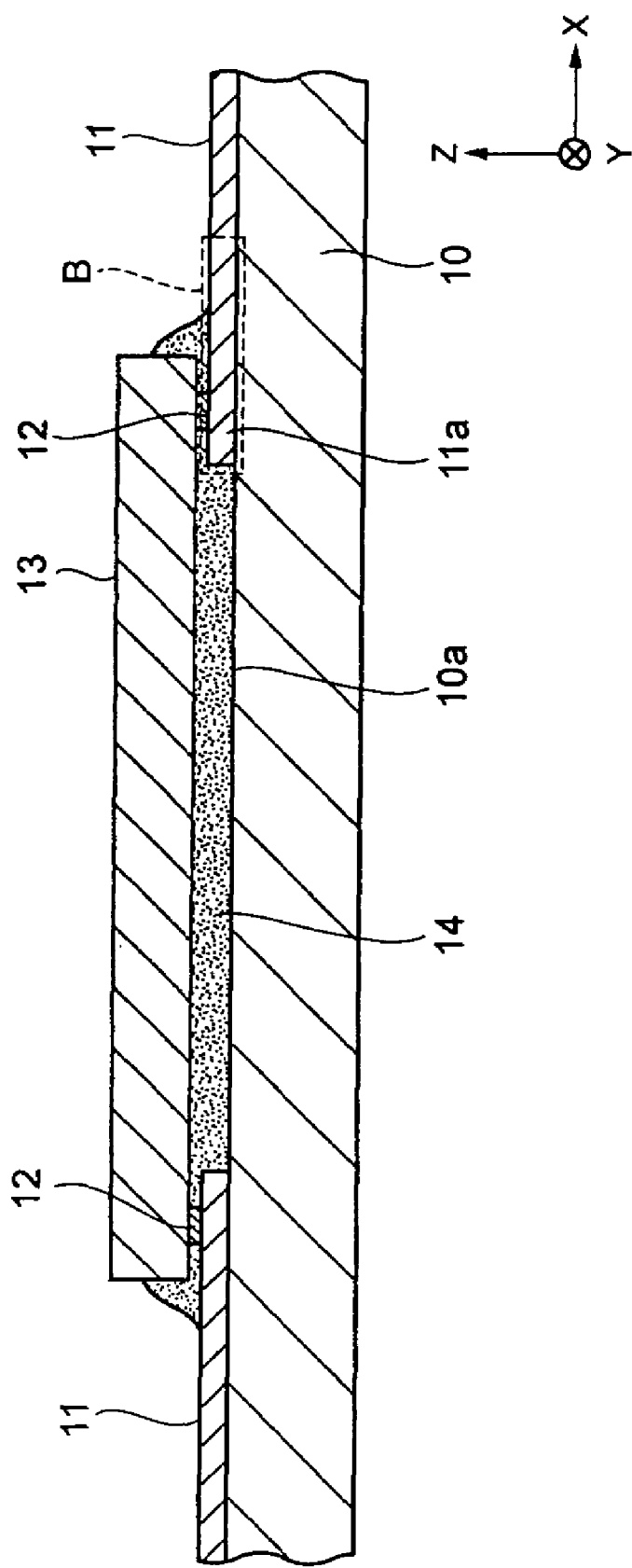
FIG. 2 is a partial cross-sectional view of the wiring substrate and the electronic part when the wiring substrate and the electronic part are taken along line A-A shown in FIG. 1 in a height direction (Z direction) and viewed in an arrow direction.
Figure 3:
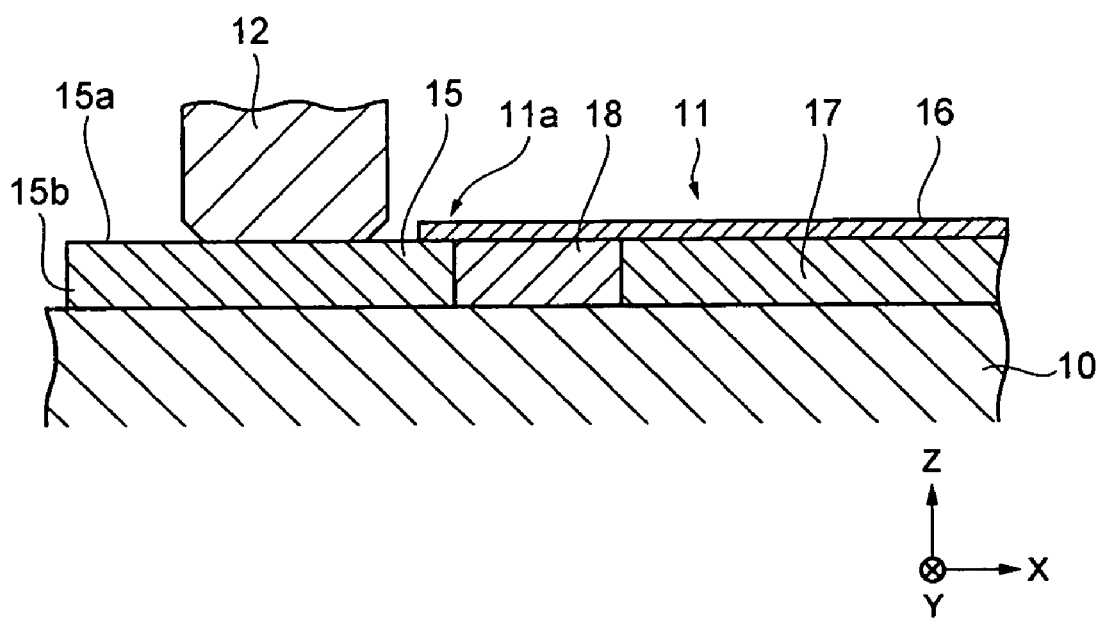
FIG. 3 is a partial enlarged cross-sectional view of the wiring substrate and the electronic part, in which a portion B shown in FIG. 2 is enlarged.
Figure 4:
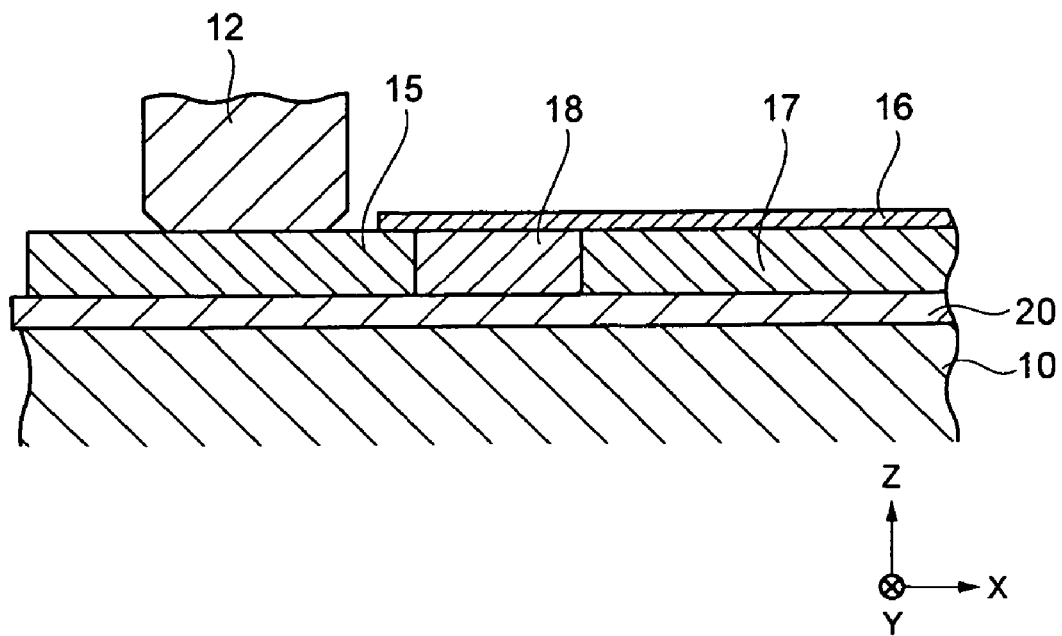
FIG. 4 is a partial enlarged cross-sectional view of a wiring substrate and an electronic part different from those shown FIG. 3.
Figure 5:
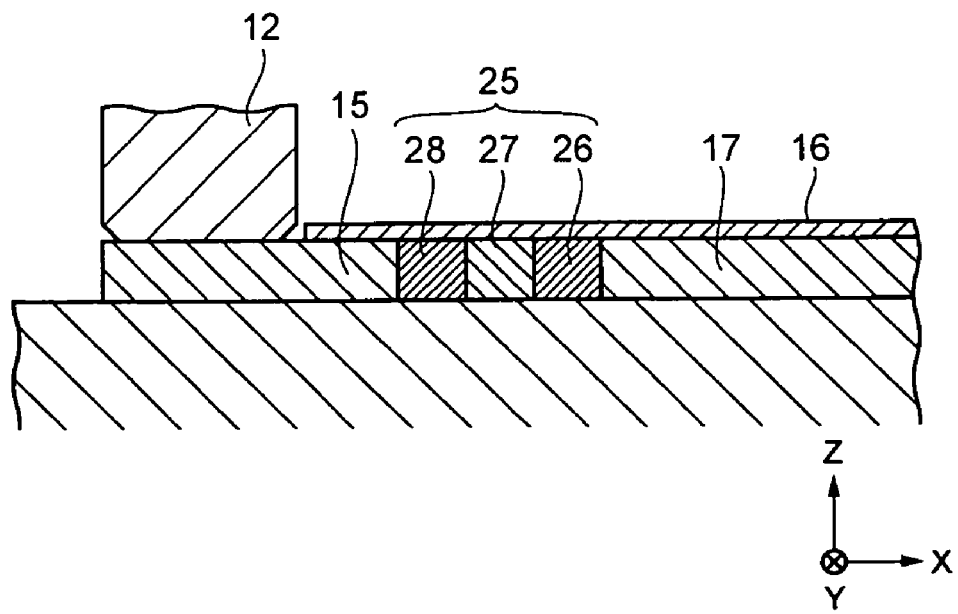
FIG. 5 is a partial enlarged cross-sectional view of a wiring substrate and an electronic part different from those shown in FIGS. 3 and 4.
Figure 6:
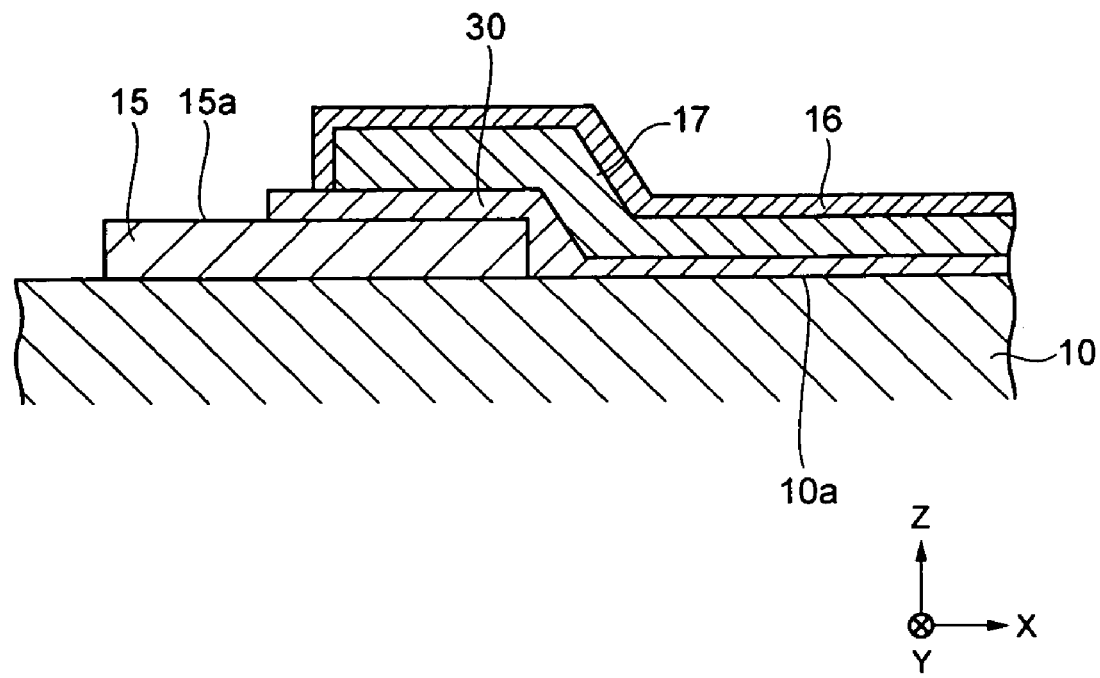
FIG. 6 is a partial enlarged cross-sectional view of a wiring substrate and an electronic part different from those shown in FIGS. 3 to 5.

FIG. 1 is a partial plan view of a wiring substrate and an electronic part for showing a state that the electronic part is mounted on the wiring substrate according to an embodiment of the present invention, FIG. 2 is a partial cross-sectional view of the wiring substrate and the electronic part when the wiring substrate and the electronic part are taken along line A-A shown in FIG. 1 in a height direction (Z direction) and viewed in an arrow direction, FIG. 3 is a partial enlarged cross-sectional view of the wiring substrate and the electronic part, in which a portion B shown in FIG. 2 is enlarged, FIG. 4 is a partial enlarged cross-sectional view of a wiring substrate and an electronic part different from those shown FIG. 3, FIG. 5 is a partial enlarged cross-sectional view of a wiring substrate and an electronic part different from those shown in FIGS. 3 and 4, and FIG. 6 is a partial enlarged cross-sectional view of a wiring substrate and an electronic part different from those shown in FIGS. 3 to 5.

In the drawings, an X direction represents a width direction, a Y direction represents a length direction, and a Z direction represents a height direction. In addition, each direction is perpendicular to the other directions.

As shown in FIGS. 1 and 2, a plurality of wiring portions 11 is formed on an upper surface 10a of a substrate 10. The substrate 10 is made of low temperature co-fired ceramic (LTCC). The LTCC is formed by laminating a plurality of green sheets while sandwiching a conductor therebetween.

The wiring portions 11 are pattern-formed on the upper surface 10a of the substrate 10, for example, using a screen printing method. The wiring portion 11 is a coated film including conductive filler and binder resin. Alternatively, the wiring portion 11 may be formed using a sputtering method or a plating method. In addition, in this specification, only a metal element is described as a composition of the wiring portion 11. In other words, when the wiring portion 11 is the above-described coated film, the binder resin is contained in the wiring portion 11, but is not specially described. For example, "Ag wiring portion", which is expressed as a structure of the wiring portion 11, includes a case where the binder resin is contained and a case where the binder resin is not contained. Furthermore, a composition ratio of the metal element contained in the wiring portion is expressed by 100% by mass. In other words, even when the binder resin is contained in addition to the metal element, the composition ratio of the metal element contained in the wiring portion except for the binder resin is expressed by 100% by mass.

An electronic part 13 is mounted on the wiring portions 11. A plurality of connection electrodes 12 is provided on a lower surface of the electronic part 13. The wiring portions 11 extend to the lower sides of the connection electrodes 12. A front end 11a of the wiring portion 11 is in contact with the connection electrode 12 of the electronic part 13 and the width of the front end 11a is very small. A pitch width between the front ends 11a of the wiring portions 11 is very small. The width of the wiring portion 11 gradually increases and the interval between the wiring portions 11 gradually increases from the front end 11a to a rear end 11b of the wiring portion 11.

The electronic part 13 is, for example, an IC package or a bar chip including one or more memories such as CPU, MPU, ROM, and RAM. The electronic part 13 is connected to the wiring portions 11 in a flip chip fashion. A sealing resin 14 is provided between the electronic part 13 and the substrate 10.

As shown in FIG. 3, an Au wiring portion (second wiring portion) 15 is formed at the front end 11a of the wiring portion 11. An upper surface 15a, a front end surface 15b (surface facing the opposite side of the X direction), and side end surfaces (surfaces at the both sides of a direction parallel to the Y direction) of the Au wiring portion 15 are not covered with a cover portion 16 made of glass. The upper surface 15a of the Au wiring portion 15 is connected to a connection surface of a connection electrode 12 of the electronic part 13.

An Ag wiring portion (second wiring portion) 17 is formed at the rear end 11b of the wiring portion 11 than the Au wiring portion 15. In addition, a first high melting point metal portion 18 is formed between the Au wiring portion 15 and the Ag wiring portion 17.

The first high melting point metal portion 18 is made of a metal material having a melting point higher than those of the Au wiring portion 15 and the Ag wiring portion 17. Au of the Au wiring portion 15 and Ag of the Ag wiring portion 17 have melting points of about 1000° C. The first high melting point metal portion 18 is made of a metal material containing at least one element of W, Mo, and Ta. W and Ta have melting points of about 3400° C. and Mo has a melting point of 2600° C.

In the embodiment shown in FIG. 3, since the first high melting point metal portion 18 having the melting point higher than those of Au and Ag is interposed between the Au wiring portion 15 and the Ag wiring portion 17, it is possible to adequately suppress Ag from being diffused into the Au wiring portion 15. The higher the melting point of the first high melting point metal portion 18, the lower a diffusion coefficient thereof. In other words, the higher the melting point of the first high melting point metal portion, the harder the diffusion occurs. In addition, the first high melting point metal portion 18 functions as a barrier material for adequately suppressing Ag from being diffused from the Ag wiring portion 17. By providing the first high melting point metal portion 18 between the Au wiring portion 15 and the Ag wiring portion 17, the first high melting point metal portion 18 is hard to be diffused and the diffusion of Ag is also suppressed. Accordingly, it is possible to more efficiently suppress Ag from being diffused, in comparison with in the prior art in which the Ag wiring portion and the Au wiring portion are in contact with each other.

In addition, Ag is apt to be diffused into the substrate 10 made of LTCC. This is because the LTCC includes a lamination of the green sheet composed of a mixture of glass and ceramic, the glass contained in the mixture has a composition different from that of general glass and the LTTC is apt to be more easily diffused compared with an alumina substrate, and the green sheet and the wiring portion 11 having a paste shape are simultaneously fired. Furthermore, the green sheet and the wiring portion 11 having the paste shape may not be simultaneously fired, but are simultaneously fired in consideration of convenience of manufacture or cost reduction.

To this end, in the embodiment shown in FIG. 4, a second high melting point metal portion 20 is provided between the Ag wiring portion 17 and the substrate 10. In FIG. 4, the second high melting point metal portion 20 is provided below the first high melting point metal portion 18 and the Au wiring portion 15. When the second high melting point metal portion 20 is provided below the first high melting point metal portion 18 and the Au wiring portion 15, the wiring portion 11 can be formed on a flat surface of the second high melting point metal portion 20 and the wiring portion 11 can be easily formed in a predetermined shape. In particular, since the front end 11a of the wiring portion 11 is formed in a high-precision pattern, the wiring portion 11 must be formed on the flat surface without a step, if possible. Accordingly, it is preferable that the second high melting point metal portion 20 is provided below the first high melting point metal portion 18 and the Au wiring portion 15.

The second high melting point metal portion 20 is made of a metal material containing at least one element of W, Mo, and Ta, similar to the first high melting point metal portion 18. The first high melting point metal portion 18 and the second high melting point metal portion 20 may be made of a same material or different materials.

By the embodiment shown in FIG. 4, it is possible to adequately suppress Ag from being diffused between the Ag wiring portion 17 and the substrate 10.

In the embodiment shown in FIG. 5, a composition changing portion 25 in which a composition ratio of Ag gradually decreases from the Ag wiring portion 17 to the Au wiring portion 15 is formed between the Au wiring portion 15 and the Ag wiring portion 17. The composition changing portion 25 is, for example, divided into three regions having different composition ratios of Ag from the Ag wiring portion 17 to the Au wiring portion 15. An Ag high composition ratio portion 26, an Ag middle composition ratio portion 27, and an Ag low composition ratio portion 28 are formed from a side closest to the Ag wiring portion 17 to a side of the Au wiring portion 15 in that order. For example, in the Ag high composition ratio portion 26, 98% by mass of Ag and 2% by mass of Pd are contained. For example, in the Ag middle composition ratio portion 27, 95% by mass of Ag and 5% by mass of Pd are contained. For example, in the Ag low composition ratio portion 28, 90% by mass of Ag and 10% by mass of Pd are contained.

In the composition changing portion 25, the composition ratio of Ag decreases from the side of the Ag wiring portion 17 to the side of the Au wiring portion 15 in order of 98% by mass, 95% by mass, and 90% by mass. Meanwhile, Pd increases in order of 2% by mass, 5% by mass, and 10% by mass. The decrease and increase may be stepwise or continuous. The term "stepwise" represents a state that a portion in which the composition ratio of Ag is substantially uniform exists in each of the Ag high composition ratio portion 26, the Ag middle composition ratio portion 27, the Ag low composition ratio portion 28. In contrast, the term "continuous" represents a state that the portion in which the composition ratio of Ag is substantially uniform does not exist and the composition ratio of Ag slowly and continuously decreases from the side of the Ag wiring portion 17 to the side of the Au wiring portion 15. In addition, the composition ratio of Ag and the composition ratio of Pd in the composition changing portion 25 are preferably set in consideration of an electric resistance value of the composition changing portion 25.

By providing the composition changing portion 25, the composition ratio of Ag becomes lower in an interface with the Au wiring portion 15. Accordingly, it is possible to more adequately suppress Ag from being diffused into the Au wiring portion 15, in comparison with the case where the Au wiring portion 15 and the Ag wiring portion 17 are in contact with each other. In addition, since the Ag wiring portion 17 is in contact with the Ag high composition portion 26 having the high composition ratio of Ag, a difference in the composition ratio of Ag near the interface between the Ag wiring portion 17 and the Ag high composition ratio portion 26 is small. Thus, it is possible to adequately suppress Ag from being diffused into the Ag high composition ratio portion 26. Accordingly, in the embodiment shown in FIG. 5, it is possible to more adequately suppress Ag from being diffused into the Au wiring portion 15, in comparison with the prior art in which the Ag wiring portion 17 and the Au wiring portion 15 are in contact with each other.

In the Ag high composition ratio portion 26, the Ag middle composition ratio portion 27, and the Ag low composition ratio portion, Pd is preferably used as a metal element other than Ag. By adding Pd, it is possible to adequately suppress Ag from being diffused. It is preferable that the composition ratio of Pd increases from the side of the Ag wiring portion 17 to the side of the Au wiring portion 15. Even in the embodiment shown in FIG. 5, the composition ratio of Pd increases in order of 2% by mass, 5% by mass, and 10% by mass from the side of the Ag wiring portion 17 to the side of the Au wiring portion 15.

Although not shown, even in the embodiment shown in FIG. 5, a high melting point metal portion is preferably provided between at least the Ag wiring portion 17 and the substrate 10, similar to FIG. 4. Accordingly, it is possible to adequately suppress Ag from being diffused between the Ag wiring portion 17 and the substrate 10. A high melting point metal portion is more preferably provided between the composition changing portion 25 and the substrate 10. Since the composition changing portion 25 also contains Ag, it is preferable that the high melting point metal portion is provided between the substrate 10 and the composition changing portion 25 in order to adequately suppress Ag from being diffused from the composition changing portion 25.

In the embodiments shown in FIGS. 3 to 5, the Au wiring portion 15, the first high melting point metal portion 18 (or the composition changing portion 25), and the Ag wiring portion 17 are arranged on the substrate 10 in a planar shape. In other words, the Au wiring portion 15, the first high melting point metal portion 18 (or the composition changing portion 25), and the Ag wiring portion 17 do not overlap one another and are in contact with one another in a horizontal direction. In contrast, in FIG. 6, a high melting point metal portion 30 is formed on the Au wiring portion 15 and the Ag wiring portion 17 is formed thereon. In other words, the embodiment shown in FIG. 6 has a lamination structure in a height direction (Z direction). As shown in FIG. 6, when the high melting point metal portion 30 is formed from a portion of an upper surface 15a of the Au wiring portion 15 to the upper surface 10a of the substrate 10, the Ag wiring portion 17 is formed on the high melting point metal portion 30, and the Au wiring portion 15 and the Ag wiring portion 17 are formed to partially face each other in the height direction (Z direction), the first high melting point metal portion 18 and the second high melting point metal portion 20 need not be separately formed like FIG. 4. In addition, it is possible to form the wiring substrate in which Ag is hard to be diffused into the Au wiring portion 15 and the substrate 10 with a simple structure. Furthermore, since the Ag wiring portion 17 having a low conductive resistance is as close as possible to the Au wiring portion 15, it is possible to the suppress a conductive property from deteriorating. Since the high melting point metal portion 30 has a high conductive resistance, when the Au wiring portion 17 is as close as possible to the Au wiring portion 15, it is possible to reduce electrical loss. In addition, instead of the high melting point metal portion 30 of FIG. 6, the composition changing portion 25 described in FIG. 5 may be provided. In this case, the composition changing portion 25 is formed by laminating the Ag low composition ratio portion 28, the Ag middle composition ratio portion 27, and the Ag high composition portion 26 in that order from the bottom. A portion of the upper surface 15a of the Au wiring portion 15 shown in FIG. 6 is exposed and a connection terminal 12 of the electronic part 13 is connected to the upper surface 15a.

In the present embodiment, since it is possible to adequately suppress Ag from being diffused from the Ag wiring portion 17 to the Au wiring portion 15, it is possible to adequately prevent a void from being formed in the wiring portion 11 or to prevent disconnection from occurring like the prior art. In addition, plating may be adequately performed on the wiring portion 11.

The cover portion 16 shown in FIGS. 3 to 6 is, for example, glass, as described above. By covering at least the face of the Ag wiring portion 17 ("face" described in this specification represents an exposed surface, that is, the upper surface and the side end surface) with the cover portion 16, it is possible to adequately suppress migration of Ag. In addition, the face of the first high melting point metal portion 18 or the face of the composition changing portion 25 is preferably covered with the cover portion 16 in order to more adequately prevent the migration of Ag. Furthermore, instead of the cover portion 16 made of glass, for example, Au plating may be performed to suppress the migration of Ag. In this case, for example, the Au plating is performed over the overall face of the wiring portion 11 using nonelectrolytic plating method. In a structure in which the Au plating is performed on the face of the Au wiring portion 15, unless the plating amount is controlled with high precision, short-circuiting is apt to be generated between adjacent wiring portions 11 through the plating layer and diffusion between the Au plating and the Ag wiring portion 17 may occur. Accordingly, the cover portion 16 is preferably made of glass.

In addition, the Ag wiring portion 17 may contain a different metal element in addition to Ag. Furthermore, the Au wiring portion 15 may contain a metal element other than Au. In addition, a portion of the Au wiring portion 15 may not contain Au. In other words, the portion of the Au wiring portion 15 may contain only the metal element other than Au. The portion of the Au wiring portion 15 is made of at least a material which is harder to be diffused than Ag (having a diffusion coefficient lower than that of Ag).

In addition, "different materials" described in this specification includes a case where different composition elements are used in the materials and a case where a same composition element is used in the materials, but composition ratios thereof in the materials are different from each other. The materials having the different composition elements represent a wiring portion made of Au and a wiring portion made of Ag. In addition, the materials having the different composition ratios represent wiring portions made of Au and Ag, in which the same composition element is used, but the composition of Ag of one wiring portion (first wiring portion) is larger than that of Ag of the other wiring portion (second wiring portion). In the latter case, since Ag is necessarily contained even in the second wiring portion, the second wiring portion is preferably made of a composition element which does not contain Ag.

What is claimed is:

1. A wiring substrate comprising:
   a substrate; and
   a wiring portion formed on the substrate,
   wherein the wiring portion includes:
   a first wiring portion made of Ag,
   a second wiring portion made of Au, and
   a first high melting point metal portion interposed between the first wiring portion and the second wiring portion and having a melting point higher than those of the first wiring portion and the second wiring portion, and
   wherein the first high melting point metal portion is made of a metal material containing at least one element of W, Mo, or Ta.

2. A wiring substrate comprising:
   a substrate; and
   a wiring portion formed on the substrate,
   wherein the wiring portion includes:
   a first wiring portion made of Ag,
   a second wiring portion made of Au, the first wiring portion and the second wiring portion overlapping each other such that the first wiring portion is partially formed over the second wiring portion, and a high melting point metal portion interposed between the first wiring portion and the substrate and between the first wiring portion and the second wiring portion where the first wiring portion and the second wiring portion are overlapped, the high melting point metal portion having a melting point higher than those of the first wiring portion and the second wiring portion.

3. The wiring substrate according to claim 2, wherein the high melting point metal portion is made of a metal material containing at least one element of W, Mo, or Ta.

4. A wiring substrate comprising:
a substrate; and
a wiring portion formed on the substrate,
wherein the wiring portion includes:
   a first wiring portion made of Ag,
   a second wiring portion made Au, and
   a composition changing portion which is interposed between the first wiring portion and the second wiring portion,
wherein a composition ratio of Ag contained in the composition changing portion gradually decreases from a side of the first wiring portion to a side of the second wiring portion, and
wherein the composition changing portion contains Ag and Pd and a composition ratio of Pd increases from the side of the first wiring portion to the side of the second wiring portion.

5. A wiring substrate comprising:
a substrate; and
a wiring portion formed on the substrate,
wherein the wiring portion includes:
   a first wiring portion made of Ag,
   a second wiring portion made of Au, and
   a composition changing portion which is interposed between the first wiring portion and the second wiring portion,
wherein a composition ratio of Ag contained in the composition changing portion gradually decreases from a side of the first wiring portion to a side of the second wiring portion, and
wherein a high melting point metal portion having a melting point higher than those of the first wiring portion and the second wiring portion is formed between the substrate and at least the first wiring portion.

6. The wiring substrate according to claim 5, wherein the high melting point metal portion is made of a metal material containing at least one element of W, Mo, or Ta.

7. A wiring substrate comprising:
a substrate; and
a wiring portion formed on the substrate,
wherein the wiring portion includes:
   a first wiring portion made of Ag,
   a second wiring portion made of a material different from that of the first wiring portion, and
   a composition changing portion which is interposed between the first wiring portion and the second wiring portion,
wherein a composition ratio of Ag contained in the composition changing portion gradually decreases from a side of the first wiring portion to a side of the second wiring portion, and
wherein the second wiring portion is made of Au.

8. A wiring substrate comprising:
a substrate; and
a wiring portion formed on the substrate,
wherein the wiring portion includes:
   a first wiring portion made of Ag,
   a second wiring portion made of a material different from that of the first wiring portion, and
   a high melting point metal portion interposed between the first wiring portion and the second wiring portion and having a melting point higher than those of the first wiring portion and the second wiring portion,
wherein the second wiring portion is made of Au and the high melting point metal portion is made of a metal material containing at least one element of W, Mo, or Ta.

9. The wiring substrate according to claim 1, wherein the wiring portion further includes:
a second high melting point metal portion formed between the substrate and at least the first wiring portion, the second high melting point metal portion having a melting point higher than those of the first wiring portion and the second wiring portion and being made of a metal material containing at least one element of W, Mo, or Ta.

* * * * *